(12) United States Patent
Lee et al.

(10) Patent No.: US 12,224,201 B2
(45) Date of Patent: Feb. 11, 2025

(54) SINGLE CRYSTALLINE SILICON STACK FORMATION AND BONDING TO A CMOS WAFER

(71) Applicant: Micron Technology, Inc., Boise, ID (US)

(72) Inventors: Si-Woo Lee, Boise, ID (US); Byung Yoon Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/403,866

(22) Filed: Jan. 4, 2024

(65) Prior Publication Data

US 2024/0153813 A1 May 9, 2024

Related U.S. Application Data

(60) Division of application No. 17/749,282, filed on May 20, 2022, now Pat. No. 11,869,803, which is a continuation of application No. 17/086,536, filed on Nov. 2, 2020, now Pat. No. 11,342,218.

(51) Int. Cl.
| | |
|---|---|
| *H01L 21/02* | (2006.01) |
| *H01L 21/762* | (2006.01) |
| *H01L 25/00* | (2006.01) |
| *H01L 25/18* | (2023.01) |

(52) U.S. Cl.
CPC ............ *H01L 21/76251* (2013.01); *H01L 21/02532* (2013.01); *H01L 21/02598* (2013.01); *H01L 25/18* (2013.01); *H01L 25/50* (2013.01); *H01L 21/02381* (2013.01)

(58) Field of Classification Search
CPC ......... H01L 21/76251; H01L 21/02532; H01L 21/02598
See application file for complete search history.

(56) References Cited

U.S. PATENT DOCUMENTS

| | | | |
|---|---|---|---|
| 9,793,283 B1 | 10/2017 | Pang | |
| 9,871,034 B1 | 1/2018 | Or-Bach | |
| 10,297,583 B2 | 5/2019 | Bonart | |
| 10,388,665 B1 * | 8/2019 | Xie | ............ H01L 21/02592 |

(Continued)

OTHER PUBLICATIONS

U.S. Appl. No. 16/204,224, entitled, "Memory Arrays," filed Nov. 29, 2018, 43 pages.

*Primary Examiner* — Thao P Le
(74) *Attorney, Agent, or Firm* — Brooks, Cameron & Huebsch, PLLC

(57) ABSTRACT

Systems, methods, and apparatus are provided for single crystalline silicon stack formation and bonding to a complementary metal oxide semiconductor (CMOS) wafer for formation of vertical three dimensional (3D) memory. An example method for forming arrays of vertically stacked layers for formation of memory cells includes providing a silicon substrate, forming a layer of single crystal silicon germanium onto a surface of the substrate, epitaxially growing the silicon germanium to form a thicker silicon germanium layer, forming a layer of single crystal silicon onto a surface of the silicon germanium, epitaxially growing the silicon germanium to form a thicker silicon layer, and forming, in repeating iterations, layers of silicon germanium and silicon to form a vertical stack of alternating silicon and silicon germanium layers.

20 Claims, 10 Drawing Sheets

(56) References Cited

U.S. PATENT DOCUMENTS

| | | | |
|---|---|---|---|
| 10,607,995 B2* | 3/2020 | Roberts | H10B 12/05 |
| 10,978,297 B1* | 4/2021 | Luan | H01L 29/74 |
| 11,031,333 B2 | 6/2021 | Zhu | |
| 11,164,872 B1* | 11/2021 | Pulugurtha | H10B 12/05 |
| 2007/0158804 A1 | 7/2007 | Hosoya | |
| 2008/0081423 A1 | 4/2008 | Sadwick | |
| 2018/0323200 A1 | 11/2018 | Tang et al. | |
| 2019/0103406 A1 | 4/2019 | Tang et al. | |
| 2019/0164985 A1 | 5/2019 | Lee et al. | |
| 2020/0251347 A1 | 8/2020 | Hopkins | |
| 2020/0328280 A1* | 10/2020 | Gandhi | H10B 43/27 |
| 2021/0050364 A1* | 2/2021 | Tapias | H10B 43/27 |
| 2021/0098486 A1 | 4/2021 | Hopkins | |
| 2021/0134829 A1 | 5/2021 | Hopkins | |
| 2021/0202515 A1* | 7/2021 | Chandolu | H10B 43/27 |
| 2021/0265385 A1 | 8/2021 | Rajashekhar | |
| 2021/0343728 A1* | 11/2021 | Surthi | H01L 29/40117 |
| 2021/0343729 A1 | 11/2021 | Surthi | |
| 2021/0351183 A1 | 11/2021 | Ingle | |
| 2021/0366927 A1 | 11/2021 | Kim | |
| 2021/0391352 A1* | 12/2021 | Abdelrahaman | H10B 43/27 |
| 2022/0139767 A1* | 5/2022 | Lee | H01L 25/16 257/183 |
| 2024/0321683 A1* | 9/2024 | Park | H01L 23/473 |
| 2024/0324094 A1* | 9/2024 | Park | H01L 23/49838 |
| 2024/0324220 A1* | 9/2024 | Hosomura | H01L 25/18 |
| 2024/0324221 A1* | 9/2024 | Kanamori | H10B 41/27 |
| 2024/0324250 A1* | 9/2024 | Yanagidaira | G11C 16/3459 |

* cited by examiner

`US 12,224,201 B2`

SINGLE CRYSTALLINE SILICON STACK FORMATION AND BONDING TO A CMOS WAFER

PRIORITY INFORMATION

This application is a divisional of U.S. application Ser. No. 17/749,282, filed on May 20, 2022, which is a continuation of U.S. application Ser. No. 17/086,536, filed Nov. 2, 2020, issued as U.S. Pat. No. 11,342,218, on May 24, 2022, the contents of which are incorporated herein by reference.

TECHNICAL FIELD

The present disclosure relates generally to memory devices, and more particularly, to single crystalline silicon stack formation and bonding to a complementary metal oxide semiconductor (CMOS) wafer for formation of a vertical three dimensional (3D) memory.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), cross-point memory, ferroelectric random-access memory (FeRAM), or the like.

As design rules shrink, less semiconductor space is available to fabricate memory, including DRAM arrays. A respective memory cell for DRAM may include an access device, e.g., transistor, having a first and a second source/drain regions separated by a channel region. A gate may oppose the channel region and be separated therefrom by a gate dielectric. An access line, such as a word line, is electrically connected to the gate of the DRAM cell. A DRAM cell can include a storage node, such as a capacitor cell, coupled by the access device to a digit line. The access device can be activated (e.g., to select the cell) by an access line coupled to the access transistor. The capacitor can store a charge corresponding to a data value of a respective cell (e.g., a logic "1" or "0").

DETAILED DESCRIPTION

Embodiments of the present disclosure describe systems, apparatus, and methods for formation of a single crystalline silicon stack and bonding to a CMOS wafer.

In vertically stacked memory array structures, such as transistor structures, polycrystalline silicon (also referred to as polysilicon) can be leaky, allowing current to leak through the polycrystalline structure, making the transistor less effective. Single crystal silicon is not very leaky, however, single crystal silicon cannot grow on amorphous dielectric materials, such as oxides or nitrides, which are the common materials upon which transistors are formed. Additionally, the temperatures required for growth of single crystal silicon are too high for CMOS components, upon which vertically stacked memory array structures can be formed, thereby prohibiting use of single crystal silicon in such implementations.

However, as disclosed in the embodiments of the present disclosure, it is possible to use a silicon wafer for a transistor that can be utilized as a substrate during the high temperature processes required for single crystal silicon formation. In such embodiments, a layer of silicon germanium can be grown on the silicon substrate. Single crystal silicon can, then, be grown on the silicon germanium.

This may be accomplished, for example, by providing a thin single crystal silicon germanium layer, as a seed layer, and then heating the layer to grow the single crystal silicon germanium layer thickness through epitaxial growth. Once the desired layer thickness is formed, a silicon layer can be formed into the surface of the silicon germanium layer. As with the silicon germanium layer, this may be accomplished, for example, by providing a thin single crystal silicon layer, as a seed layer, and then heating the layer to grow the thin single crystal silicon layer thickness into a thicker single crystal silicon layer through epitaxial growth.

Figure 4:
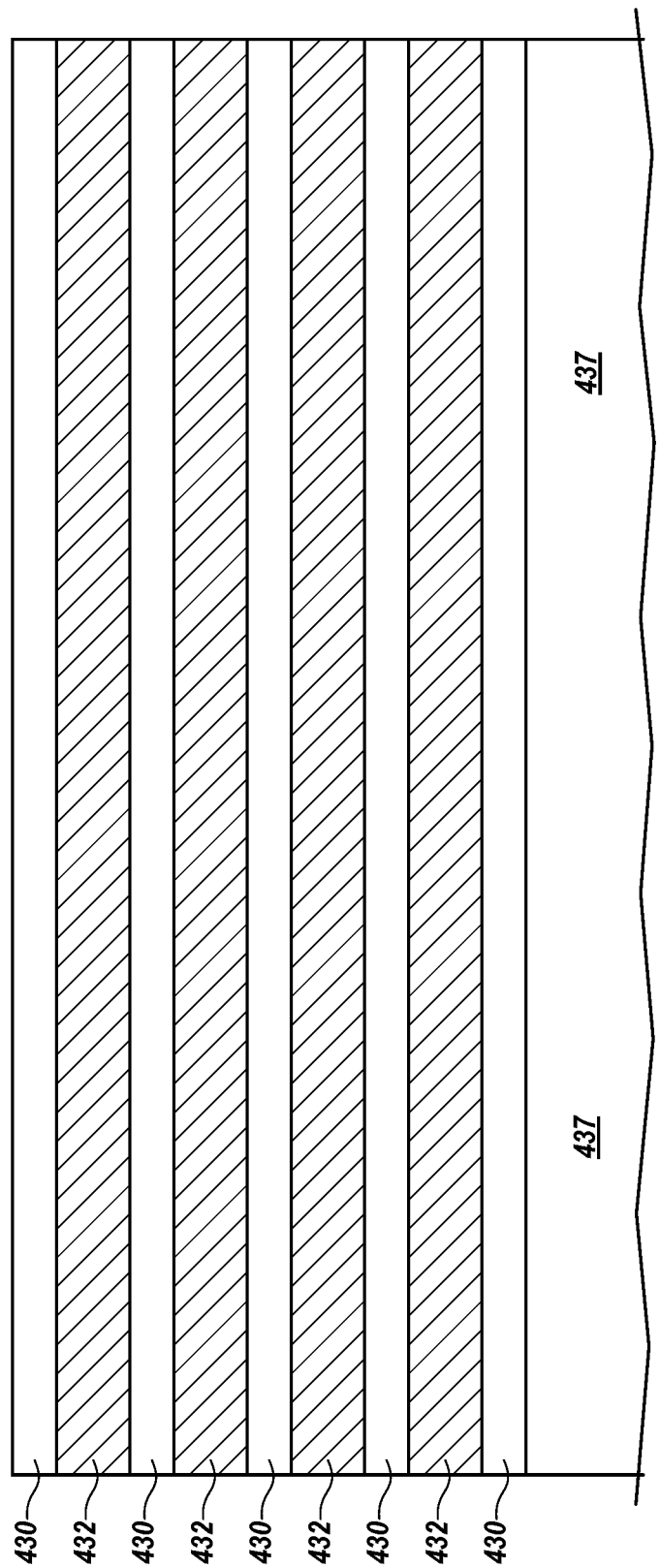
FIG. 4 illustrates an example process for creating a single crystalline silicon stack for vertical three dimensional (3D) memory, in accordance with a number of embodiments of the present disclosure.

Depending on the silicon germanium concentration, if silicon is x quantity and germanium is y quantity and, if y is smaller than x, then silicon/silicon germanium has a small lattice mismatch with respect to the lattice of single crystal silicon. This allows silicon to be grown on top of silicon germanium with a single crystal structure. If a thin layer of single crystal silicon is applied to the surface of the silicon germanium, then the whole silicon layer acts as a seed for the growth of the single crystal silicon layer. Such layering can be done in alternating iterations (e.g., SiGe/Si/SiGe/Si, etc.) to create a superlattice structure in the form of a vertical stack such as shown in FIG. 4.

For example, a seed layer of silicon germanium can be formed that is 100 Angstroms in thickness (height) and can be grown to, for example 1000 Angstroms. A thin silicon seed layer can be formed on the surface of the silicon germanium layer that is, for example, 50 Angstroms and can be grown to a thickness of, for example, 300 Angstroms. These thicknesses are merely provided as examples and should not be regarded as limiting unless recited explicitly in a particular claim.

This unpatterned (no patterning within the layers) vertical stack can, then, be attached to a CMOS wafer. Since there is no pattern within any of the vertical stack layers yet, alignment between the CMOS wafer and the vertical stack can be less precise, as for example, interconnections between the vertical stack and the CMOS wafer are not yet defined in the vertical stack. The transistor devices of the present disclosure will have better performance with regard to I-on, better I-off, drivability, and/or leakage current because there is no grain boundary and therefore current cannot leak through the grain boundary which is where leakage often occurs in polysilicon. In some embodiments, devices can have, for example, three orders of magnitude lower I-off (leakage).

Advantages to the structure and process described herein can include a lower off-current (Ioff) for the access devices, as compared to silicon based (Si-based) access devices (e.g., transistors), and/or reduced gate/drain induced leakage (GIDL) for the access devices.

The figures herein follow a numbering convention in which the first digit or digits correspond to the figure number of the drawing and the remaining digits identify an element or component in the drawing. Similar elements or components between different figures may be identified by the use of similar digits. For example, reference numeral 104 may reference element "04" in FIG. 2A, and a similar element may be referenced as 204 in FIG. 2B. Multiple analogous elements within one figure may be referenced with a reference numeral followed by a hyphen and another numeral or a letter. For example, 302-1 may reference element 302-1 in FIGS. 3 and 302-2 may reference element 302-2, which may be analogous to element 302-1. Such analogous elements may be generally referenced without the hyphen and extra numeral or letter. For example, elements 302-1 and 302-2 or other analogous elements may be generally referenced as 302.

Figure 1A:
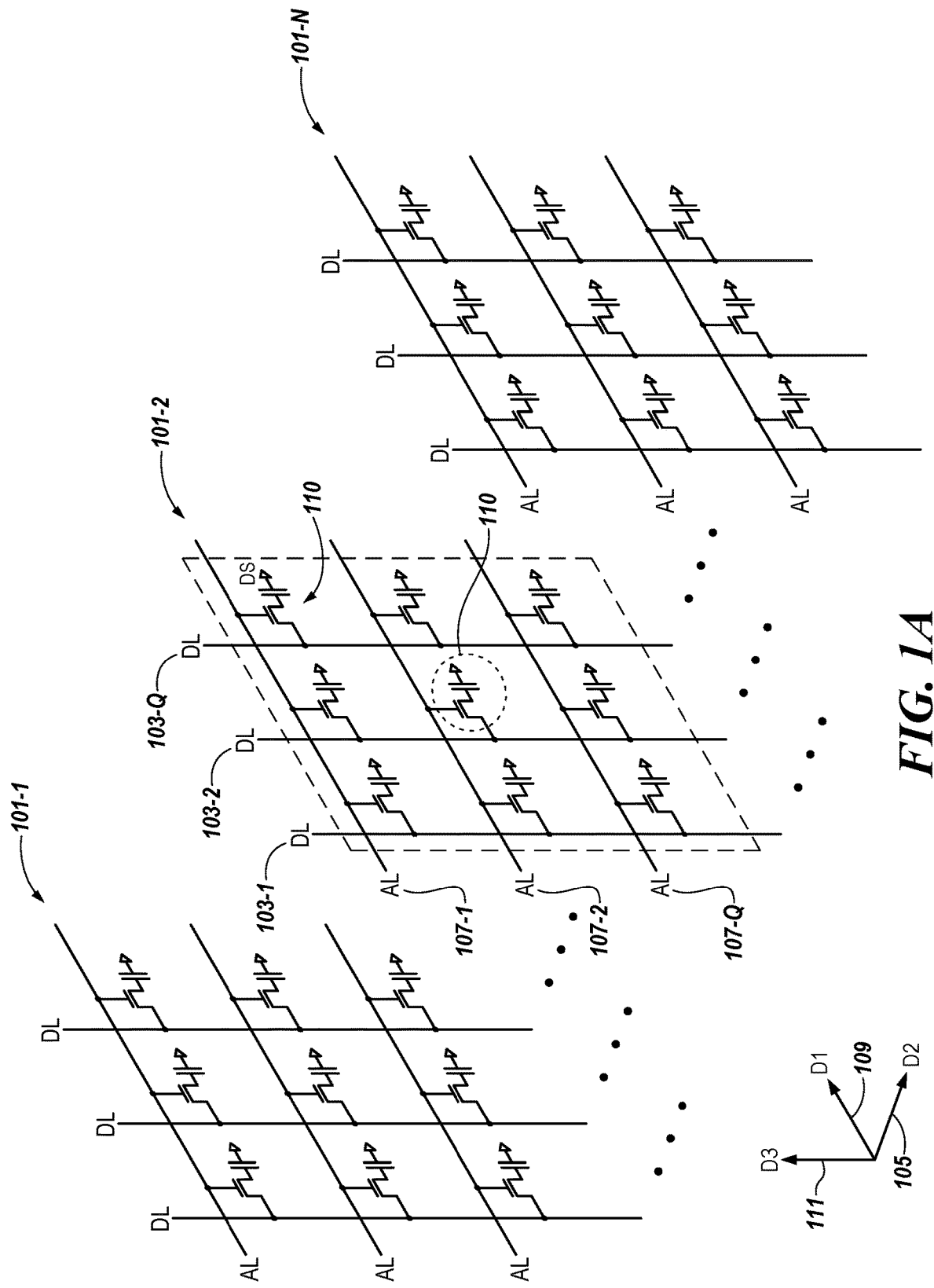
FIG. 1A is a schematic illustration of a vertical three dimensional (3D) memory in accordance a number of embodiments of the present disclosure.

FIG. 1A is a block diagram of an apparatus in accordance with a number of embodiments of the present disclosure. FIG. 1A illustrates a circuit diagram showing a cell array of a three dimensional (3D) semiconductor memory device according to embodiments of the present disclosure. FIG. 1A illustrates that a cell array may have a plurality of sub cell arrays 101-1, 101-2, . . . , 101-N. The sub cell arrays 101-1, 101-2, . . . , 101-N may be arranged along a second direction (D2) 105. Each of the sub cell arrays, e.g., sub cell array 101-2, may include a plurality of access lines 107-1, 107-2, . . . , 107-Q (which also may be referred to a word lines). Also, each of the sub cell arrays, e.g., sub cell array 101-2, may include a plurality of digit lines 103-1, 103-2, . . . , 103-Q (which also may be referred to as bit lines, data lines, or sense lines). In FIG. 1A, the access lines 107-1, 107-2, . . . , 107-Q are illustrated extending in a first direction (D1) 109 and the digit lines 103-1, 103-2, . . . , 103-Q are illustrated extending in a third direction (D3) 111. According to embodiments, the first direction (D1) 109 and the second direction (D2) 105 may be considered in a horizontal ("X-Y") plane. The third direction (D3) 111 may be considered in a vertical ("Z") plane. Hence, according to embodiments described herein, the digit lines 103-1, 103-2, . . . , 103-Q are extending in a vertical direction, e.g., third direction (D3) 111.

A memory cell, e.g., 110, may include an access device, e.g., access transistor, and a storage node located at an intersection of each access line 107-1, 107-2, . . . , 107-Q and each digit line 103-1, 103-2, . . . , 103-Q. Memory cells may be written to, or read from, using the access lines 107-1, 107-2, . . . , 107-Q and digit lines 103-1, 103-2, . . . , 103-Q. The access lines 107-1, 107-2, . . . , 107-Q may conductively interconnect memory cells along horizontal rows of each sub cell array 101-, 101-2, . . . , 101-N, and the digit lines 103-1, 103-2, . . . , 103-Q may conductively interconnect memory cells along vertical columns of each sub cell array 101-, 101-2, . . . , 101-N. One memory cell, e.g. 110, may be located between one access line, e.g., 107-2, and one digit line, e.g., 103-2. Each memory cell may be uniquely addressed through a combination of an access line 107-1, 107-2, . . . , 107-Q and a digit line 103-1, 103-2, . . . , 103-Q.

The access lines 107-1, 107-2, . . . , 107-P may be or include conducting patterns (e.g., metal lines) disposed on and spaced apart from a substrate. The access lines 107-1, 107-2, . . . , 107-Q may extend in a first direction (D1) 109. The access lines 107-1, 107-2, . . . , 107-Q in one sub cell array, e.g., 101-2, may be spaced apart from each other in a vertical direction, e.g., in a third direction (D3) 111.

The digit lines 103-1, 103-2, . . . , 103-Q may be or include conductive patterns (e.g., metal lines) extending in a vertical direction with respect to the substrate, e.g., in a third direction (D3) 111. The digit lines in one sub cell array, e.g., 101-2, may be spaced apart from each other in the first direction (D1) 109.

A gate of a memory cell, e.g., memory cell 110, may be connected to an access line, e.g., 107-2, and a first conductive node, e.g., first source/drain region, of an access device, e.g., transistor, of the memory cell 110 may be connected to a digit line, e.g., 103-2. Each of the memory cells, e.g., memory cell 110, may be connected to a storage node, e.g., capacitor. A second conductive node, e.g., second source/drain region, of the access device, e.g., transistor, of the memory cell 110 may be connected to the storage node, e.g., capacitor. While first and second source/drain region references are used herein to denote two separate and distinct source/drain regions, it is not intended that the source/drain region referred to as the "first" and/or "second" source/drain regions have some unique meaning. It is intended only that one of the source/drain regions is connected to a digit line, e.g., 103-2, and the other may be connected to a storage node.

Figure 1B:
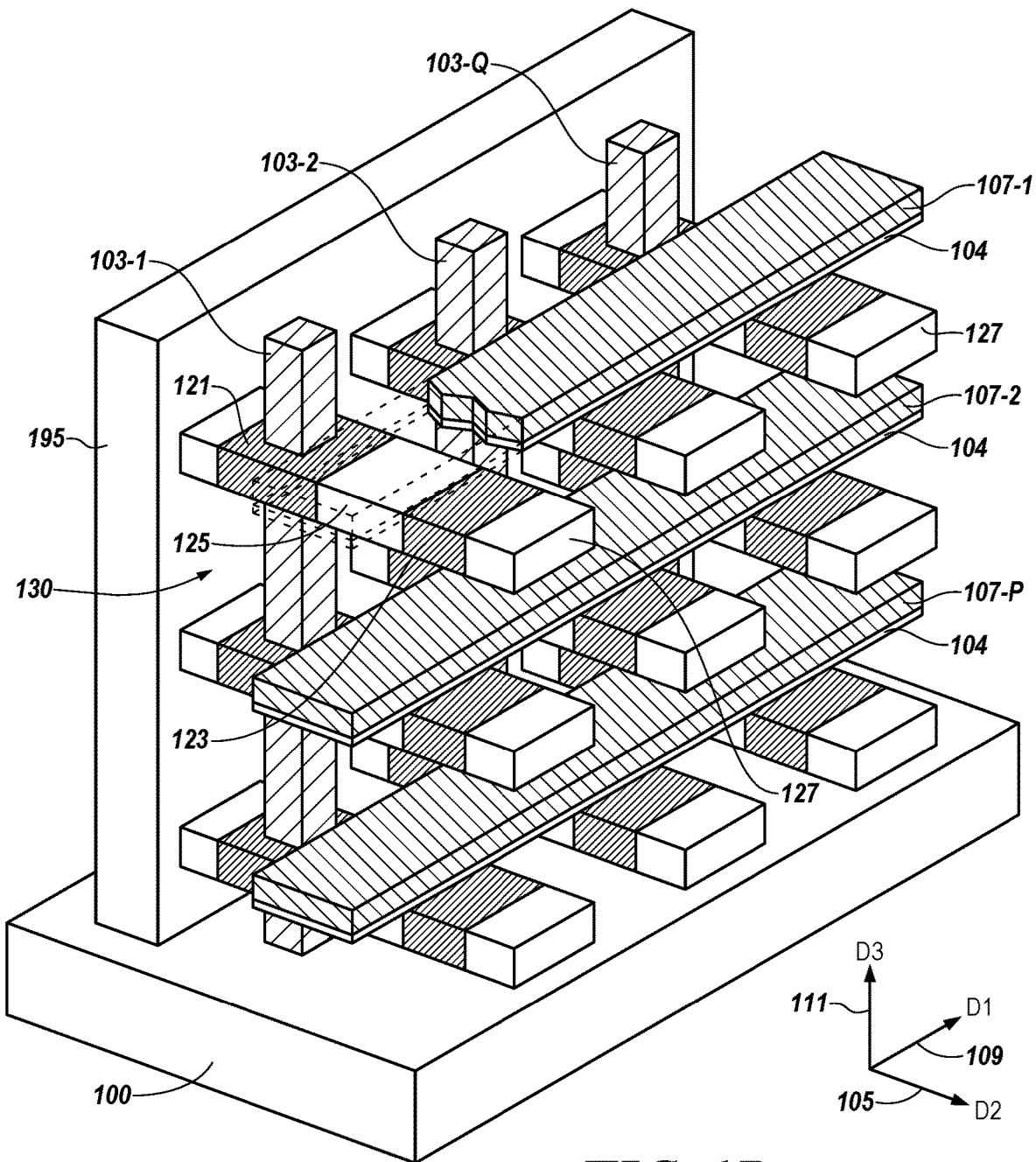
FIG. 1B is a perspective view illustrating a portion of a digit line and body contact for semiconductor devices in accordance with a number of embodiments of the present disclosure.

FIG. 1B illustrates a perspective view showing a three dimensional (3D) semiconductor memory device, e.g., a portion of a sub cell array 101-2 shown in FIG. 1A as a vertically oriented stack of memory cells in an array, according to some embodiments of the present disclosure.

As shown in FIG. 1B, a substrate 100 may have formed thereon one of the plurality of sub cell arrays, e.g., 101-2, described in connection with FIG. 1A. For example, the substrate 100 may be or include a silicon substrate, a germanium substrate, or a silicon-germanium substrate, etc. Embodiments, however, are not limited to these examples.

As shown in the example embodiment of FIG. 1B, the substrate 100 may have fabricated thereon a vertically oriented stack of memory cells, e.g., memory cell 110 in FIG. 1A, extending in a vertical direction, e.g., third direction (D3) 111. According to some embodiments the vertically oriented stack of memory cells may be fabricated such that each memory cell, e.g., memory cell 110 in FIG. 1A, is formed on plurality of vertical levels, e.g., a first level (L1), a second level (L2), and a third level (L3). The repeating, vertical levels, L1, L2, and L3, may be arranged, e.g., "stacked", a vertical direction, e.g., third direction (D3) 111 shown in FIG. 1A, and may be separated from the substrate 100 by an insulator material 120. Each of the repeating, vertical levels, L1, L2, and L3 may include a plurality of discrete components, e.g., regions, to the horizontally oriented access devices 130, e.g., transistors, and storage nodes, e.g., capacitors, including access line 107-1, 107-2, . . . , 107-Q connections and digit line 103-1, 103-2, . . . , 103-Q connections. The plurality of discrete components to the horizontally oriented access devices 130, e.g., transistors, may be formed in a plurality of iterations of vertically, repeating layers within each level, as described in more detail below in connection with FIGS. 4A-4K, and may extend horizontally in the second direction (D2) 105, analogous to second direction (D2) 105 shown in FIG. 1A.

The plurality of discrete components to the laterally oriented access devices 130, e.g., transistors, may include a first source/drain region 121 and a second source/drain region 123 separated by a channel region 125, extending laterally in the second direction (D2) 105, and formed in a body of the access devices. In some embodiments, the channel region 125 may include silicon, germanium, silicon-germanium, and/or indium gallium zinc oxide (IGZO). In some embodiments, the first and the second source/drain regions, 121 and 123, can include an n-type dopant region formed in a p-type doped body to the access device to form an n-type conductivity transistor. In some embodiments, the first and the second source/drain regions, 121 and 123, may include a p-type dopant formed within an n-type doped body to the access device to form a p-type conductivity transistor. By way of example, and not by way of limitation, the n-type dopant may include phosphorous (P) atoms and the p-type dopant may include atoms of boron (B) formed in an oppositely doped body region of polysilicon semiconductor material. Embodiments, however, are not limited to these examples.

The storage node 127, e.g., capacitor, may be connected to one respective end of the access device. As shown in FIG. 1B, the storage node 127, e.g., capacitor, may be connected to the second source/drain region 123 of the access device. The storage node may be or include memory elements capable of storing data. Each of the storage nodes may be a memory element using one of a capacitor, a magnetic tunnel junction pattern, and/or a variable resistance body which includes a phase change material, etc. Embodiments, however, are not limited to these examples. In some embodiments, the storage node associated with each access device of a unit cell, e.g., memory cell 110 in FIG. 1A, may similarly extend in the second direction (D2) 105, analogous to second direction (D2) 105 shown in FIG. 1A.

As shown in FIG. 1B a plurality of horizontally oriented access lines 107-1, 107-2, . . . , 107-Q extend in the first direction (D1) 109, analogous to the first direction (D1) 109 in FIG. 1A. The plurality of horizontally oriented access lines 107-1, 107-2, . . . , 107-Q may be analogous to the access lines 107-1, 107-2, . . . , 107-Q shown in FIG. 1A. The plurality of horizontally oriented access lines 107-1, 107-2, . . . , 107-Q may be arranged, e.g., "stacked", along the third direction (D3) 111. The plurality of horizontally oriented access lines 107-1, 107-2, . . . , 107-Q may include a conductive material. For example, the conductive material may include one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc. Embodiments, however, are not limited to these examples.

Among each of the vertical levels, (L1) 113-1, (L2) 113-2, and (L3) 113-P, the horizontally oriented memory cells, e.g., memory cell 110 in FIG. 1A, may be spaced apart from one another horizontally in the first direction (D1) 109. However, the plurality of discrete components to the horizontally oriented access devices 130, e.g., first source/drain region 121 and second source/drain region 123 separated by a channel region 125, extending laterally in the second direction (D2) 105, and the plurality of horizontally oriented access lines 107-1, 107-2, . . . , 107-Q extending laterally in the first direction (D1) 109, may be formed within different vertical layers within each level. For example, the plurality of horizontally oriented access lines 107-1, 107-2, . . . , 107-Q, extending in the first direction (D1) 109, may be formed on a top surface opposing and electrically coupled to the channel regions 125, separated therefrom by a gate dielectric, and orthogonal to horizontally oriented access devices 130, e.g., transistors, extending in laterally in the second direction (D2) 105. In some embodiments, the plurality of horizontally oriented access lines 107-1, 107-2, . . . , 107-Q, extending in the first direction (D1) 109 are formed in a higher vertical layer, farther from the substrate 100, within a level, e.g., within level (L1), than a layer in which the discrete components, e.g., first source/drain region 121 and second source/drain region 123 separated by a channel region 125, of the horizontally oriented access device are formed.

As shown in the example embodiment of FIG. 1B, the digit lines, 103-1, 103-2, . . . , 103-Q, extend in a vertical direction with respect to the substrate 100, e.g., in a third direction (D3) 111. Further, as shown in FIG. 1B, the digit lines, 103-1, 103-2, . . . , 103-Q, in one sub cell array, e.g., sub cell array 101-2 in FIG. 1A, may be spaced apart from each other in the first direction (D1) 109. The digit lines, 103-1, 103-2, . . . , 103-Q, may be provided, extending vertically relative to the substrate 100 in the third direction (D3) 111 in vertical alignment with source/drain regions to serve as first source/drain regions 121 or, as shown, be vertically adjacent first source/drain regions 121 for each of the horizontally oriented access devices 130, e.g., transistors, extending laterally in the second direction (D2) 105, but adjacent to each other on a level, e.g., first level (L1), in the first direction (D1) 109. Each of the digit lines, 103-1, 103-2, . . . , 103-Q, may vertically extend, in the third direction (D3), on sidewalls, adjacent first source/drain regions 121, of respective ones of the plurality of horizontally oriented access devices 130, e.g., transistors, that are vertically stacked. In some embodiments, the plurality of vertically oriented digit lines 103-1, 103-2, . . . , 103-Q, extending in the third direction (D3) 111, may be connected to side surfaces of the first source/drain regions 121 directly and/or through additional contacts including metal silicides.

For example, a first one of the vertically extending digit lines, e.g., 103-1, may be adjacent a sidewall of a first source/drain region 121 to a first one of the horizontally oriented access devices 130, e.g., transistors, in the first level (L1) 113-1, a sidewall of a first source/drain region 121 of a first one of the horizontally oriented access devices 130, e.g., transistors, in the second level (L2) 113-2, and a sidewall of a first source/drain region 121 a first one of the horizontally oriented access devices 130, e.g., transistors, in the third level (L3) 113-P, etc. Similarly, a second one of the vertically extending digit lines, e.g., 103-2, may be adjacent a sidewall to a first source/drain region 121 of a second one of the horizontally oriented access devices 130, e.g., transistors, in the first level (L1) 113-1, spaced apart from the first one of horizontally oriented access devices 130, e.g., transistors, in the first level (L1) 113-1 in the first direction (D1) 109. And the second one of the vertically extending digit lines, e.g., 103-2, may be adjacent a sidewall of a first source/drain region 121 of a second one of the laterally oriented access devices 130, e.g., transistors, in the second level (L2) 113-2, and a sidewall of a first source/drain region 121 of a second one of the horizontally oriented access devices 130, e.g., transistors, in the third level (L3) 113-P, etc. Embodiments are not limited to a particular number of levels.

The vertically extending digit lines, 103-1, 103-2, . . . , 103-Q, may include a conductive material, such as, for example, one of a doped semiconductor material, a conductive metal nitride, metal, and/or a metal-semiconductor compound. The digit lines, 103-1, 103-2, . . . , 103-Q, may correspond to digit lines (DL) described in connection with FIG. 1A.

As shown in the example embodiment of FIG. 1B, a conductive body contact may be formed extending in the first direction (D1) 109 along an end surface of the horizontally oriented access devices 130, e.g., transistors, in each level (L1) 113-1, (L2) 113-2, and (L3) 113-P above the substrate 100. The body contact may be connected to a body (as shown by 336 in FIG. 3) e.g., body region, of the horizontally oriented access devices 130, e.g., transistors, in each memory cell, e.g., memory cell 110 in FIG. 1A. The body contact may include a conductive material such as, for example, one of a doped semiconductor material, a conductive metal nitride, metal, and/or a metal-semiconductor compound.

Figure 2A:
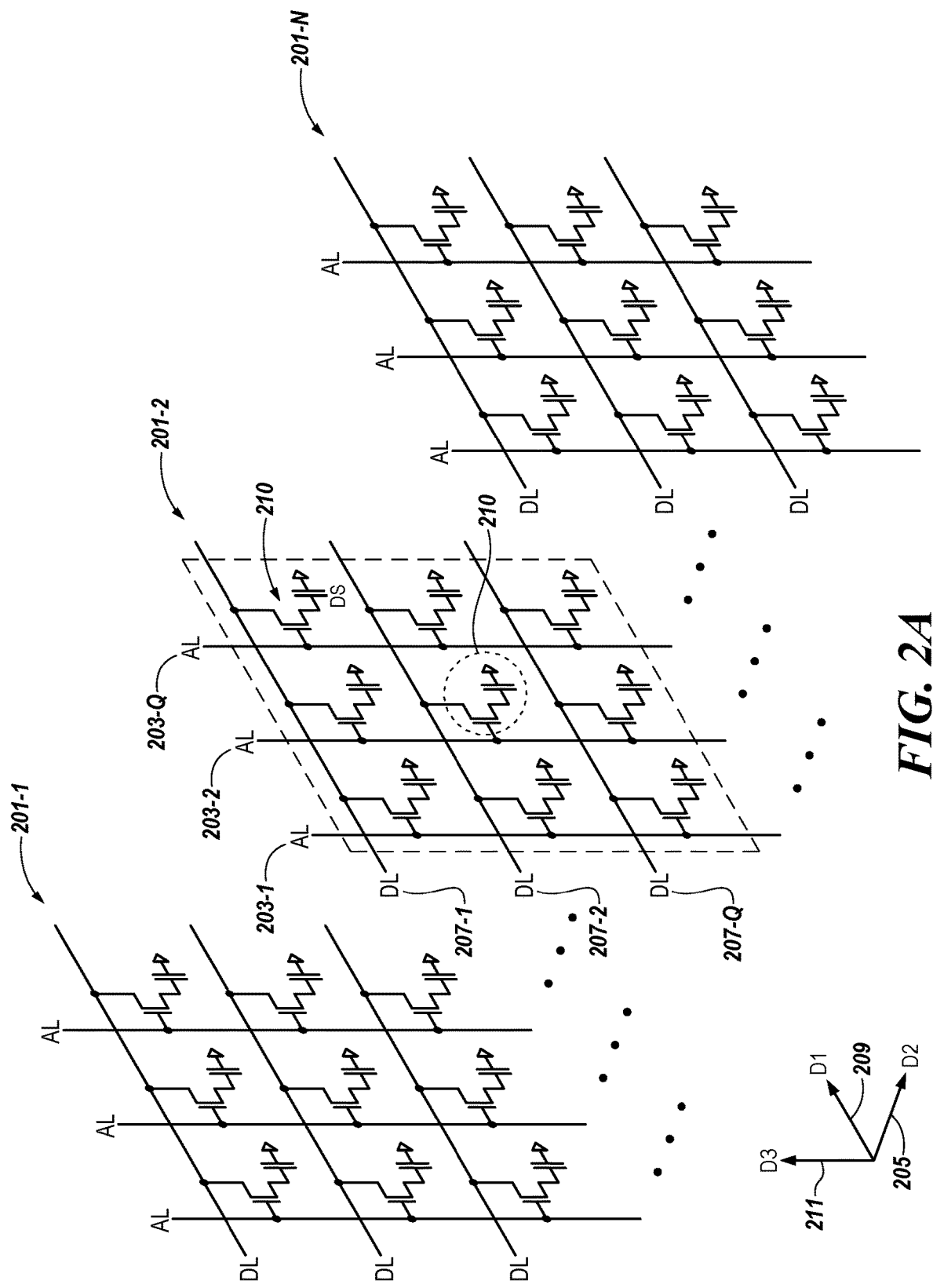
FIG. 2A is a schematic illustration of a vertical three dimensional (3D) memory in accordance a number of embodiments of the present disclosure.

Although not shown in FIG. 1B, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples. FIG. 2A is a block diagram of an apparatus in accordance with a number of embodiments of the present disclosure. FIG. 2A illustrates a circuit diagram showing a cell array of a three dimensional (3D) semiconductor memory device according to embodiments of the present disclosure. FIG. 2A illustrates that a cell array may have a plurality of sub cell arrays 201-1, 201-2, . . . , 201-N. The sub cell arrays 201-1, 201-2, . . . , 201-N may be arranged along a second direction (D2) 205. Each of the sub cell arrays (e.g., sub cell array 201-2) may include a plurality of access lines 203-1, 203-2, . . . , 203-Q (which also may be referred to as word lines). Also, each of the sub cell arrays (e.g., sub cell array 201-2) may include a plurality of digit lines 207-1, 207-2, . . . , 207-Q (which also may be referred to as bit lines, data lines, or sense lines). In FIG. 2A, the digit lines 207-1, 207-2, . . . , 207-Q are illustrated extending in a first direction (D1) 209 and the access lines 203-1, 203-2, . . . , 203-Q are illustrated extending in a third direction (D3) 211.

The first direction (D1) 209 and the second direction (D2) 205 may be considered in a horizontal ("X-Y") plane. The third direction (D3) 211 may be considered in a vertical ("Z") direction (e.g., transverse to the X-Y plane). Hence, according to embodiments described herein, the access lines 203-1, 203-2, . . . , 203-Q are extending in a vertical direction (e.g., third direction (D3) 211).

A memory cell (e.g., 210) may include an access device (e.g., access transistor) and a storage node located at an intersection of each access line 203-1, 203-2, . . . , 203-Q and each digit line 207-1, 207-2, . . . , 207-Q. Memory cells may be written to, or read from, using the access lines 203-1, 203-2, . . . , 203-Q and digit lines 207-1, 207-2, . . . , 207-Q. The digit lines 207-1, 207-2, . . . , 207-Q may conductively interconnect memory cells along horizontal columns of each sub cell array 201-, 201-2, . . . , 201-N, and the access lines 203-1, 203-2, . . . , 203-Q may conductively interconnect memory cells along vertical rows of each sub cell array 201-1, 201-2, . . . , 201-N. One memory cell, e.g., 210, may be located between one access line (e.g., 203-2) and one digit line (e.g., 207-2). Each memory cell may be uniquely addressed through a combination of an access line 203-1, 203-2, . . . , 203-Q and a digit line 207-1, 207-2, . . . , 207-Q.

The digit lines 207-1, 207-2, . . . , 207-Q may be or include conducting patterns (e.g., metal lines) disposed on and spaced apart from a substrate. The digit lines 207-1, 207-2, . . . , 207-Q may extend in a first direction (D1) 209. The digit lines 207-1, 207-2, . . . , 207-Q in one sub cell array (e.g., 201-2) may be spaced apart from each other in a vertical direction (e.g., in a third direction (D3) 211).

The access lines 203-1, 203-2, . . . , 203-Q may be or include conductive patterns (e.g., metal lines) extending in a vertical direction with respect to the substrate (e.g., in a third direction (D3) 211). The access lines in one sub cell array (e.g., 201-2) may be spaced apart from each other in the first direction (D1) 209.

A gate of a memory cell (e.g., memory cell 210) may be connected to an access line (e.g., 203-2) and a first conductive node (e.g., first source/drain region) of an access device (e.g., transistor) of the memory cell 210 may be connected to a digit line (e.g., 207-2). Each of the memory cells (e.g., memory cell 210) may be connected to a storage node (e.g., capacitor). A second conductive node (e.g., second source/drain region) of the access device (e.g., transistor) of the memory cell 210 may be connected to the storage node (e.g., capacitor). Storage nodes, such as capacitors, can be formed from ferroelectric and/or dielectric materials such as zirconium oxide (ZrO2), hafnium oxide (HfO2) oxide, lanthanum oxide (La2O3), lead zirconate titanate (PZT, Pb[Zr(x)Ti(1-x)]O3), barium titanate (BaTiO3), aluminum oxide (e.g., Al2O3), a combination of these with or without dopants, or other suitable materials.

While first and second source/drain region reference are used herein to denote two separate and distinct source/drain regions, it is not intended that the source/drain region referred to as the "first" and/or "second" source/drain regions have some unique meaning. It is intended only that one of the source/drain regions is connected to a digit line (e.g., 207-2) and the other may be connected to a storage node.

Figure 2B:
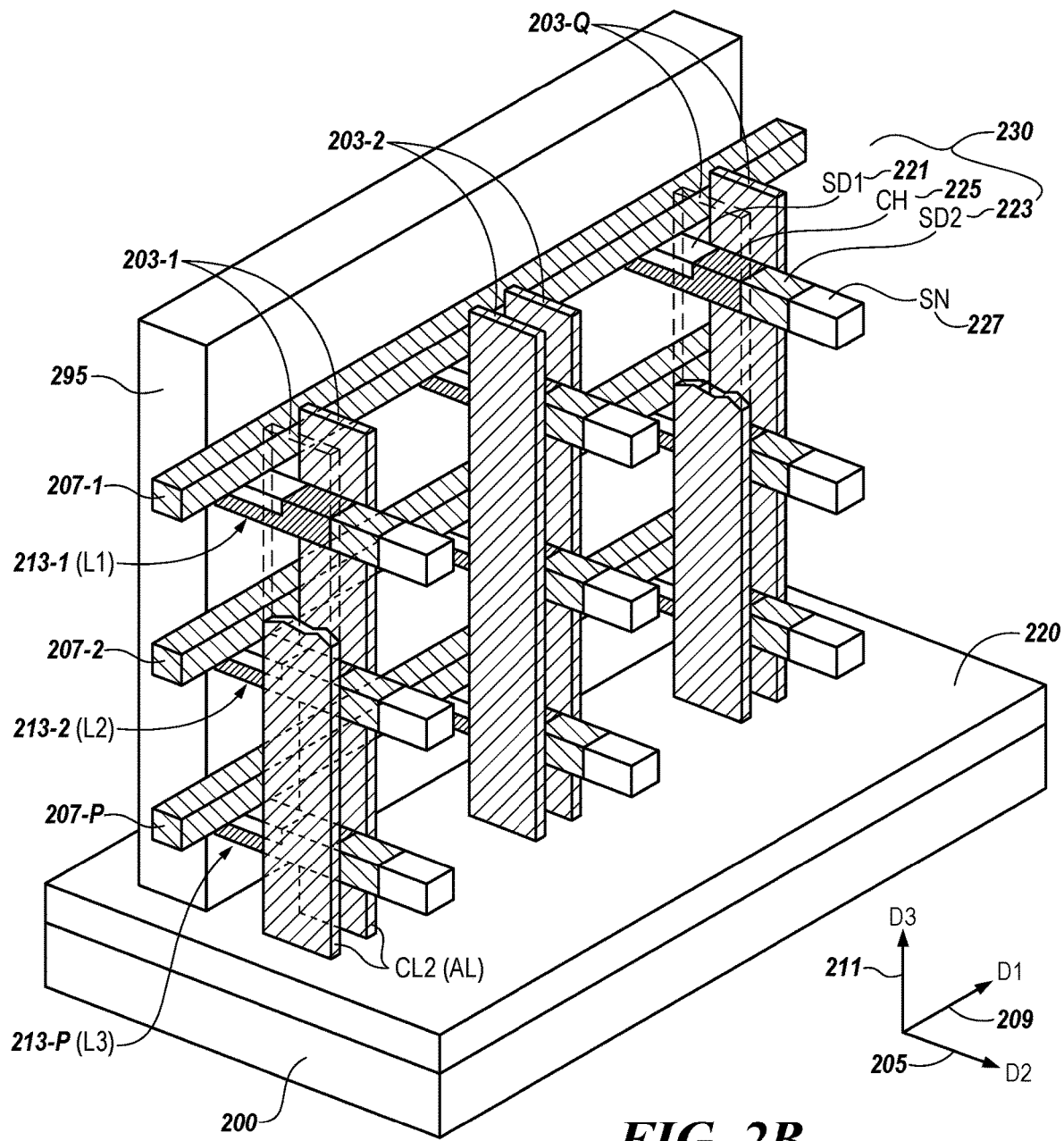
FIG. 2B is a perspective view illustrating a portion of a three-node access device in a vertical three dimensional (3D) memory array in accordance with a number of embodiments of the present disclosure.
Figure 3:
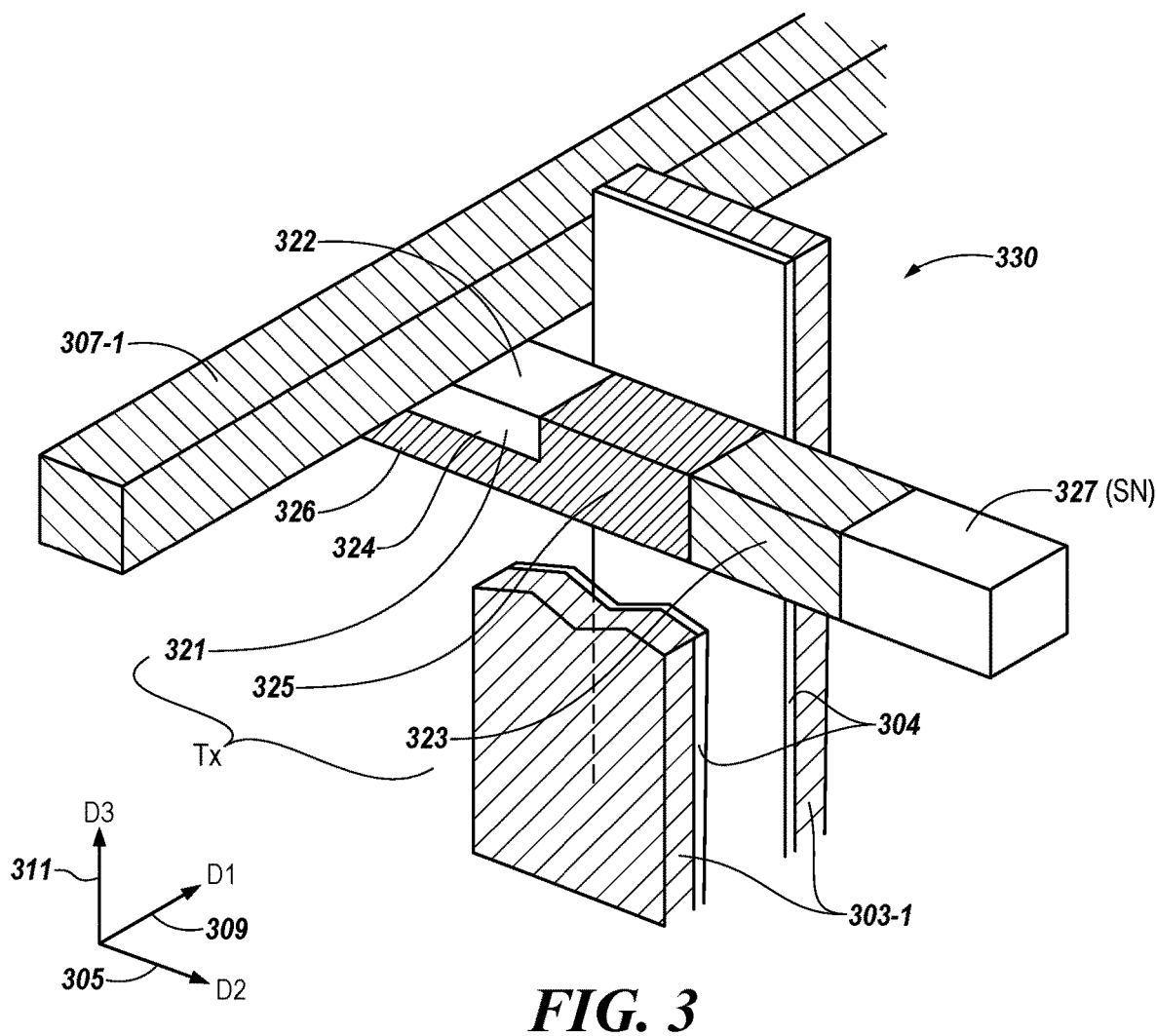
FIG. 3 is a perspective view illustrating a portion of a three-node access device in a vertical three dimensional (3D) memory cell in accordance with a number of embodiments of the present disclosure.

FIG. 2B illustrates a perspective view showing a three dimensional (3D) semiconductor memory device (e.g., a portion of a sub cell array 201-2 shown in FIG. 2A as a vertically oriented stack of memory cells in an array) according to some embodiments of the present disclosure. FIG. 3 illustrates a perspective view showing unit cell (e.g., memory cell 210 shown in FIG. 2A) of the 3D semiconductor memory device shown in FIG. 2B.

As shown in FIG. 2B, a substrate 200 may have formed thereon one of the plurality of sub cell arrays (e.g., 201-2) described in connection with FIG. 2A. For example, the substrate 200 may be or include a silicon substrate, a germanium substrate, or a silicon-germanium substrate, etc. Embodiments, however, are not limited to these examples.

As shown in the example embodiment of FIG. 2B, the substrate 200 may have fabricated thereon a vertically oriented stack of memory cells (e.g., memory cell 210 in FIG. 2A) extending in a vertical direction (e.g., third direction (D3) 211). According to some embodiments the vertically oriented stack of memory cells may be fabricated such that each memory cell (e.g., memory cell 210 in FIG. 2A) is formed on plurality of vertical levels (e.g., a first level (L1), a second level (L2), and a third level (L3)). The repeating, vertical levels, L1, L2, and L3, may be arranged (e.g., "stacked") a vertical direction (e.g., third direction (D3) 211 shown in FIG. 2A) and may be separated from the substrate 200 by an insulator material 220. Each of the repeating, vertical levels, L1, L2, and L3 may include a plurality of discrete components (e.g., regions) to the laterally oriented access devices 230 (e.g., transistors) and storage nodes (e.g., capacitors) including access line 203-1, 203-2, . . . , 203-Q connections and digit line 207-1, 207-2, . . . , 207-Q connections. The plurality of discrete components to the laterally oriented access devices 230 (e.g., transistors) may be formed in a plurality of iterations of vertically, repeating layers within each level, as described in more detail below in connection with FIGS. 4A-4K, and may extend horizontally in the second direction (D2) 205, analogous to second direction (D2) 205 shown in FIG. 2A.

The plurality of discrete components to the laterally oriented access devices 230 (e.g., transistors) may include a first source/drain region 221 and a second source/drain region 223 separated by a channel region 225, extending laterally in the second direction (D2) 205, and formed in a body of the access devices. In some embodiments, the channel region 225 may include silicon, germanium, silicon-germanium, and/or indium gallium zinc oxide (IGZO). In some embodiments, the first and the second source/drain regions, 221 and 223, can include an n-type dopant region formed in a p-type doped body to the access device to form an n-type conductivity transistor. In some embodiments, the first and the second source/drain regions, 221 and 223, may include a p-type dopant formed within an n-type doped body to the access device to form a p-type conductivity transistor. By way of example, and not by way of limitation, the n-type dopant may include phosphorous (P) atoms and the p-type dopant may include atoms of boron (B) formed in an oppositely doped body region of polysilicon semiconductor material. Embodiments, however, are not limited to these examples.

The storage node 227 (e.g., capacitor) may be connected to one respective end of the access device. As shown in FIG. 2B, the storage node 227 (e.g., capacitor) may be connected to the second source/drain region 223 of the access device. The storage node may be or include memory elements capable of storing data. Each of the storage nodes may be a memory element using one of a capacitor, a magnetic tunnel junction pattern, and/or a variable resistance body which includes a phase change material, etc. Embodiments, however, are not limited to these examples. In some embodiments, the storage node associated with each access device of a unit cell (e.g., memory cell 210 in FIG. 2A) may similarly extend in the second direction (D2) 205, analogous to second direction (D2) 205 shown in FIG. 2A.

As shown in FIG. 2B a plurality of horizontally oriented digit lines 207-1, 207-2, . . . , 207-Q extend in the first direction (D1) 209, analogous to the first direction (D1) 209 in FIG. 2A. The plurality of horizontally oriented digit lines 207-1, 207-2, . . . , 207-Q may be analogous to the digit lines 207-1, 207-2, . . . , 207-Q shown in FIG. 2A. The plurality of horizontally oriented digit lines 207-1, 207-2, . . . , 207-Q may be arranged (e.g., "stacked") along the third direction (D3) 211. The plurality of horizontally oriented digit lines 207-1, 207-2, . . . , 207-Q may include a conductive material. For example, the conductive material may include one or more of a doped semiconductor (e.g., doped silicon, doped germanium, etc.) a conductive metal nitride (e.g., titanium nitride, tantalum nitride, etc.) a metal (e.g., tungsten (W), titanium (Ti), tantalum (Ta), ruthenium (Ru), cobalt (Co), molybdenum (Mo), etc.) and/or a metal-semiconductor compound (e.g., tungsten silicide, cobalt silicide, titanium silicide, etc.) Embodiments, however, are not limited to these examples.

Among each of the vertical levels, (L1) 213-1, (L2) 213-2, and (L3) 213-P, the horizontally oriented memory cells (e.g., memory cell 210 in FIG. 2A) may be spaced apart from one another horizontally in the first direction (D1) 209. However, as described in more detail below in connection with FIGS. 4A, et seq., the plurality of discrete components to the laterally oriented access devices 230 (e.g., first source/drain region 221 and second source/drain region 223 separated by a channel region 225), extending laterally in the second direction (D2) 205, and the plurality of horizontally oriented digit lines 207-1, 207-2, . . . , 207-Q, extending laterally in the first direction (D1) 209, may be formed within different vertical layers within each level. For example, the plurality of horizontally oriented digit lines 207-1, 207-2, . . . , 207-Q, extending in the first direction (D1) 209, may be disposed on, and in electrical contact with, top surfaces of first source/drain regions 221 and orthogonal to laterally oriented access devices 230 (e.g., transistors) extending laterally in the second direction (D2) 205. In some embodiments, the plurality of horizontally oriented digit lines 207-1, 207-2, . . . , 207-Q, extending in the first direction (D1) 209 are formed in a higher vertical layer, farther from the substrate 200, within a level (e.g., within level (L1)) than a layer in which the discrete components (e.g., first source/drain region 221 and second source/drain region 223 separated by a channel region 225) of the laterally oriented access device are formed. In some embodiments, the plurality of horizontally oriented digit lines 207-1, 207-2, . . . , 207-Q, extending in the first direction (D1) 209, may be connected to the top surfaces of the first source/drain regions 221 directly and/or through additional contacts including metal silicides.

As shown in the example embodiment of FIG. 2B, the access lines, 203-1, 203-2, . . . , 203-Q, extend in a vertical direction with respect to the substrate 200 (e.g., in a third direction (D3) 211). Further, as shown in FIG. 2B, the access lines, 203-1, 203-2, . . . , 203-Q, in one sub cell array (e.g., sub cell array 201-2 in FIG. 2A) may be spaced apart from each other in the first direction (D1) 209. The access lines, 203-1, 203-2, . . . , 203-Q, may be provided, extending vertically relative to the substrate 200 in the third direction (D3) 211 between a pair of the laterally oriented access devices 230 (e.g., transistors) extending laterally in the second direction (D2) 205, but adjacent to each other on a level (e.g., first level (L1)) in the first direction (D1) 209. Each of the access lines, 203-1, 203-2, . . . , 203-Q, may vertically extend, in the third direction (D3), on sidewalls of respective ones of the plurality of laterally oriented access devices 230 (e.g., transistors) that are vertically stacked.

For example, and as shown in more detail in FIG. 3, a first one of the vertically extending access lines (e.g., 203-1) may be adjacent a sidewall of a channel region 225 to a first one of the laterally oriented access devices 230 (e.g., transistors) in the first level (L1) 213-1, a sidewall of a channel region 225 of a first one of the laterally oriented access devices 230 (e.g., transistors) in the second level (L2) 213-2, and a sidewall of a channel region 225 a first one of the laterally oriented access devices 230 (e.g., transistors) in the third level (L3) 213-P, etc. Similarly, a second one of the vertically extending access lines (e.g., 203-2) may be adjacent a sidewall to a channel region 225 of a second one of the laterally oriented access devices 230 (e.g., transistors) in the first level (L1) 213-1, spaced apart from the first one of laterally oriented access devices 230 (e.g., transistors) in the first level (L1) 213-1 in the first direction (D1) 209. And the second one of the vertically extending access lines (e.g., 203-2) may be adjacent a sidewall of a channel region 225 of a second one of the laterally oriented access devices 230 (e.g., transistors) in the second level (L2) 213-2, and a sidewall of a channel region 225 of a second one of the laterally oriented access devices 230 (e.g., transistors) in the third level (L3) 213-P, etc. Embodiments are not limited to a particular number of levels.

The vertically extending access lines, 203-1, 203-2, . . . , 203-Q, may include a conductive material, such as, for example, one of a doped semiconductor material, a conductive metal nitride, metal, and/or a metal-semiconductor compound. The access lines, 203-1, 203-2, . . . , 203-Q, may correspond to word lines (WL) described in connection with FIG. 2A.

As shown in the example embodiment of FIG. 2B, a conductive body contact 295 may be formed extending in the first direction (D1) 209 along an end surface of the laterally oriented access devices 230 (e.g., transistors) in each level (L1) 213-1, (L2) 213-2, and (L3) 213-P above the substrate 200. The body contact 295 may be connected to a body, as shown by 336 in FIG. 3, (e.g., body region) of the laterally oriented access devices 230 (e.g., transistors) in each memory cell (e.g., memory cell 210 in FIG. 2A). The body contact 295 may include a conductive material such as, for example, one of a doped semiconductor material, a conductive metal nitride, metal, and/or a metal-semiconductor compound.

Although not shown in FIG. 2B, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples.

FIG. 3 illustrates in more detail a unit cell (e.g., memory cell 210 in FIG. 2A) of the vertically stacked array of memory cells (e.g., within a sub cell array 201-2 in FIG. 2A) according to some embodiments of the present disclosure. As shown in FIG. 3, the first and the second source/drain regions, 321 and 323, may be impurity doped regions to the laterally oriented access devices 330 (e.g., transistors). The first and the second source/drain regions, 321 and 323, may be analogous to the first and the second source/drain regions 221 and 223 shown in FIG. 2B. The first and the second source/drain regions may be separated by a channel 325 formed in a body of semiconductor material (e.g., body region 326) of the laterally oriented access devices 330 (e.g., transistors). The first and the second source/drain regions, 321 and 323, may be formed from an n-type or p-type dopant doped in the body region 326. Embodiments are not so limited.

For example, for an n-type conductivity transistor construction, the body region 326 of the laterally oriented access devices 330 (e.g., transistors) may be formed of a low doped (p−) p-type semiconductor material. In some embodiments, the body region 326 and the channel 325 separating the first and the second source/drain regions, 321 and 323, may include a low doped, p-type (e.g., low dopant concentration (p−)) polysilicon material consisting of boron (B) atoms as an impurity dopant to the polycrystalline silicon. The first and the second source/drain regions, 321 and 323, may also comprise a metal, and/or metal composite materials containing ruthenium (Ru), molybdenum (Mo), nickel (Ni), titanium (Ti), copper (Cu), a highly doped degenerate semiconductor material, and/or at least one of indium oxide ($In_2O_3$), or indium tin oxide ($In_{2-x}Sn_xO_3$), formed using an atomic layer deposition process, etc. Embodiments, however, are not limited to these examples.

As used herein, a degenerate semiconductor material is intended to mean a semiconductor material, such as polysilicon, containing a high level of doping with significant interaction between dopants (e.g., phosphorous (P), boron (B), etc.). Non-degenerate semiconductors, by contrast, contain moderate levels of doping, where the dopant atoms are well separated from each other in the semiconductor host lattice with negligible interaction.

In this example, the first and the second source/drain regions, 321 and 321, may include a high dopant concentration, n-type conductivity impurity (e.g., high dopant (n+)) doped in the first and the second source/drain regions, 321 and 323. In some embodiments, the high dopant, n-type conductivity first and second drain regions 321 and 323 may include a high concentration of phosphorus (P) atoms deposited therein. Embodiments, however, are not limited to this example. In other embodiments, the laterally oriented access devices 330 (e.g., transistors) may be of a p-type conductivity construction in which case the impurity (e.g., dopant) conductivity types would be reversed.

As shown in the example embodiment of FIG. 3, the first source/drain region 321 may occupy an upper portion in the body 326 of the laterally oriented access devices 330 (e.g., transistors). For example, the first source/drain region 321 may have a bottom surface 324 within the body 326 of the laterally oriented access device 330 which is located higher, vertically in the third direction (D3) 311, than a bottom surface of the body 326 of the laterally, horizontally oriented access device 330. As such, the laterally, horizontally oriented transistor 330 may have a body portion 326 which is below the first source/drain region 321 and is in electrical contact with the body contact (e.g., 295 shown in FIG. 2B). Further, as shown in the example embodiment of FIG. 3, a digit line (e.g., 307-1) analogous to the digit lines 207-1, 207-2, . . . , 207-Q in FIG. 2B and 207-1, 207-2, . . . , 207-Q shown in FIG. 2A, may disposed on a top surface 322 of the first source/drain region 321 and electrically coupled thereto.

As shown in the example embodiment of FIG. 3, an access line (e.g., 303-1 analogous to the access lines 203-1, 203-2, . . . , 203-Q in FIG. 2B and 203-1, 203-2, . . . , 203-Q in FIG. 2A) may be vertically extending in the third direction (D3) 311 adjacent sidewall of the channel region 325 portion of the body 326 to the laterally oriented access devices 330 (e.g., transistors) horizontally conducting between the first and the second source/drain regions 321 and 323 along the second direction (D2) 305. A gate dielectric material 304 may be interposed between the access line 303-1 (a portion thereof forming a gate to the laterally oriented access devices 330 (e.g., transistors) and the channel region 325.

The gate dielectric material 304 may include, for example, a high-k dielectric material, a silicon oxide material, a silicon nitride material, a silicon oxynitride material, etc., or a combination thereof. Embodiments are not so limited. For example, in high-k dielectric material examples the gate dielectric material 304 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

FIG. 4 illustrates an example process for creating a single crystalline silicon stack for vertical three dimensional (3D) memory, such as illustrated in FIGS. 1-3, and in accordance with a number of embodiments of the present disclosure. The vertical stack includes multiple layers of single crystal silicon germanium 430 and single crystal silicon 432 formed on a substrate 437.

As discussed above, this may be accomplished, for example, by providing a thin single crystal silicon germanium layer, as a seed layer, and then heating the layer to grow the single crystal silicon germanium layer thickness through epitaxial growth. Once the desired layer thickness is formed, a silicon layer can be formed into the surface of silicon germanium layer. As with the silicon germanium layer, this may be accomplished, for example, by providing a thin single crystal silicon layer, as a seed layer, and then heating the layer to grow the single crystal silicon layer thickness through epitaxial growth.

For example, the single crystal silicon germanium 430 may be epitaxially grown by flowing silicon base gases over the thin seed layer of single crystal silicon germanium formed, for the first layer, on the surface of the substrate 437 and for subsequent single crystal silicon germanium layers, over a thin seed layer of single crystal silicon germanium formed on the surface of the exposed single crystal silicon layer of the vertical stack. For instance, a disilane ($Si_2H_6$) gas may be utilized to cause single crystal silicon germanium to be epitaxially grown from the exposed surface of the thin layer of single crystal silicon germanium that has been deposited as a seed for the epitaxial growth of the single crystal silicon germanium. However, embodiments are not so limited. For instance, dichlorosilane ($SiH_2Cl_2$) gas may flow over the seed layer to cause single crystal silicon germanium 430 to epitaxially grow onto the exposed surface of the seed layer.

In some embodiments, flowing the silicon based gas over the seed layer at a temperature selected, for example, from between 300 degrees Celsius (° C.) to 1100° C. may cause the single crystal silicon germanium 430 to epitaxially grow at a predictable rate. Based on this predictable growth rate, the single crystal silicon germanium layer can be grown to a desired height over a predetermined time period. The temperature range can, for example, be below 900° C. for single crystal silicon and/or single crystal silicon germanium epitaxial growth, as at higher temperatures, germanium can start to diffuse and the single crystal silicon and single crystal silicon germanium can begin to mix, in some implementations. All individual values and subranges from 300° C. to 1100° C. are included; for example, the silicon gas may be flowed at temperatures having a lower limit of 300° C., 400° C., 450° C., 500° C., 350° C., 600° C., 650° C., 700° C., 750° C., 800° C., 850° C., or 900° C. to an upper limit of 900° C., 950° C., 1000° C., 1050° C., or 1100° C. Embodiments, however, are not limited to these examples. For instance, the silicon based gas may be flowed at a temperature of 300° C. to 1100° C. to cause the single crystal silicon germanium to epitaxially grow. All individual values and subranges from 300° C. to 1100° C. are included.

In addition, the silicon based gas may be flown for 1 minute to 15 minutes to cause the single crystal silicon germanium to epitaxially grow. All individual values and subranges from 1 minute to 15 minutes are included; for example, the silicon gas may be flowed for a timeframe having a lower limit of 1 minute, 2 minutes, 3 minutes, 4 minutes, 5 minutes, 6 minutes, 7 minutes, 8 minutes, 9 minutes, or 10 minutes to an upper limit of 8 minutes, 9 minutes, 10 minutes, 11 minutes, 12 minutes, 13 minutes, 14 minutes, or 15 minutes. For example, the silicon based gas may be flowed at a temperature of 800 degree ° C. to 900° C. for 7 to 10 minutes to epitaxially grow the single crystal silicon germanium.

Embodiments, however, are not limited to these examples. For instance, the length of time the silicon based gas is flowed over the single crystal silicon germanium seed layer may vary depending on the temperature of the silicon based gas. For example, the silicon based gas may be flowed for 1 minute to 500 minutes to cause the single crystal silicon to epitaxially grow, based on the temperature. All individual values and subranges from 1 minute to 500 minutes are included.

In order to form a single crystal silicon layer on the previously formed single crystal silicon germanium layer, depending on the silicon germanium concentration, if silicon is x quantity and germanium is y quantity and, if y is smaller than x, then silicon/silicon germanium has a small lattice mismatch with respect to the lattice of single crystal silicon, as discussed above. This allows single crystal silicon to be grown on top of single crystal silicon germanium with a single crystal structure. If a thin layer of single crystal silicon is applied to the surface of the single crystal silicon germanium, then the whole single crystal silicon layer acts as a seed for the growth of the single crystal silicon layer.

The process and parameters for the formation of a single crystal silicon layer are similar to those described above with respect to single crystal silicon germanium layers. For example, the single crystal silicon 432 may be epitaxially grown by flowing silicon base gases over the thin seed layer of single crystal silicon formed over a thin seed layer of single crystal silicon formed on the surface of the exposed single crystal silicon germanium layer of the vertical stack that has been formed previously. For instance, a disilane ($Si_2H_6$) gas may be utilized to cause single crystal silicon to be epitaxially grown from the exposed surface of the thin layer of single crystal silicon that has been deposited as a seed for the epitaxial growth of the single crystal silicon layer.

However, embodiments are not so limited. For instance, dichlorosilane ($SiH_2Cl_2$) gas may flow over the seed layer to cause single crystal silicon 432 to epitaxially grow onto the exposed surface of the single crystal silicon seed layer.

In some embodiments, similar to the formation of the single crystal silicon germanium layers, the flowing of the silicon based gas over the single crystal silicon seed layer at a temperature selected, for example, from between 300° C. to 1100° C. may cause the single crystal silicon 432 to epitaxially grow at a predictable rate. Based on this predictable growth rate, the single crystal silicon layer can be grown to a desired height over a predetermined time period.

All individual values and subranges from 300° C. to 1100° C. are included; for example, the silicon gas may be flowed at temperatures having a lower limit of 300° C., 400° C., 450° C., 500° C., 350° C., 600° C., 650° C., 700° C., 750° C., 800° C., 850° C., or 900° C. to an upper limit of 900° C., 950° C., 1000° C., 1050° C., or 1100° C. Embodiments, however, are not limited to these examples. For instance, the silicon based gas may be flowed at a temperature of 300° C. to 4000° C. to cause the single crystal silicon to epitaxially grow. All individual values and subranges from 300° C. to 4000° C. are included.

In addition, the silicon based gas may be flown for 1 minute to 15 minutes to cause the single crystal silicon to epitaxially grow. All individual values and subranges from 1 minute to 15 minutes are included; for example, the silicon gas may be flowed for a timeframe having a lower limit of 1 minute, 2 minutes, 3 minutes, 4 minutes, 5 minutes, 6 minutes, 7 minutes, 8 minutes, 9 minutes, or 10 minutes to an upper limit of 8 minutes, 9 minutes, 10 minutes, 11 minutes, 12 minutes, 13 minutes, 14 minutes, or 15 minutes. For example, the silicon based gas may be flowed at a temperature of 800° C. to 900° C. for 7 to 10 minutes to epitaxially grow the single crystal silicon.

Such layering can be done in alternating iterations (e.g., SiGe/Si/SiGe/Si, etc.) to create a superlattice structure in the form of a vertical stack. This unpatterned (no patterning within the layers) vertical stack can, then, be attached to a CMOS wafer, as described with respect to FIG. 5. One benefit of this process is that because the vertical stack has not been patterned yet, it does not need to be carefully aligned with the CMOS wafer.

Figure 5:
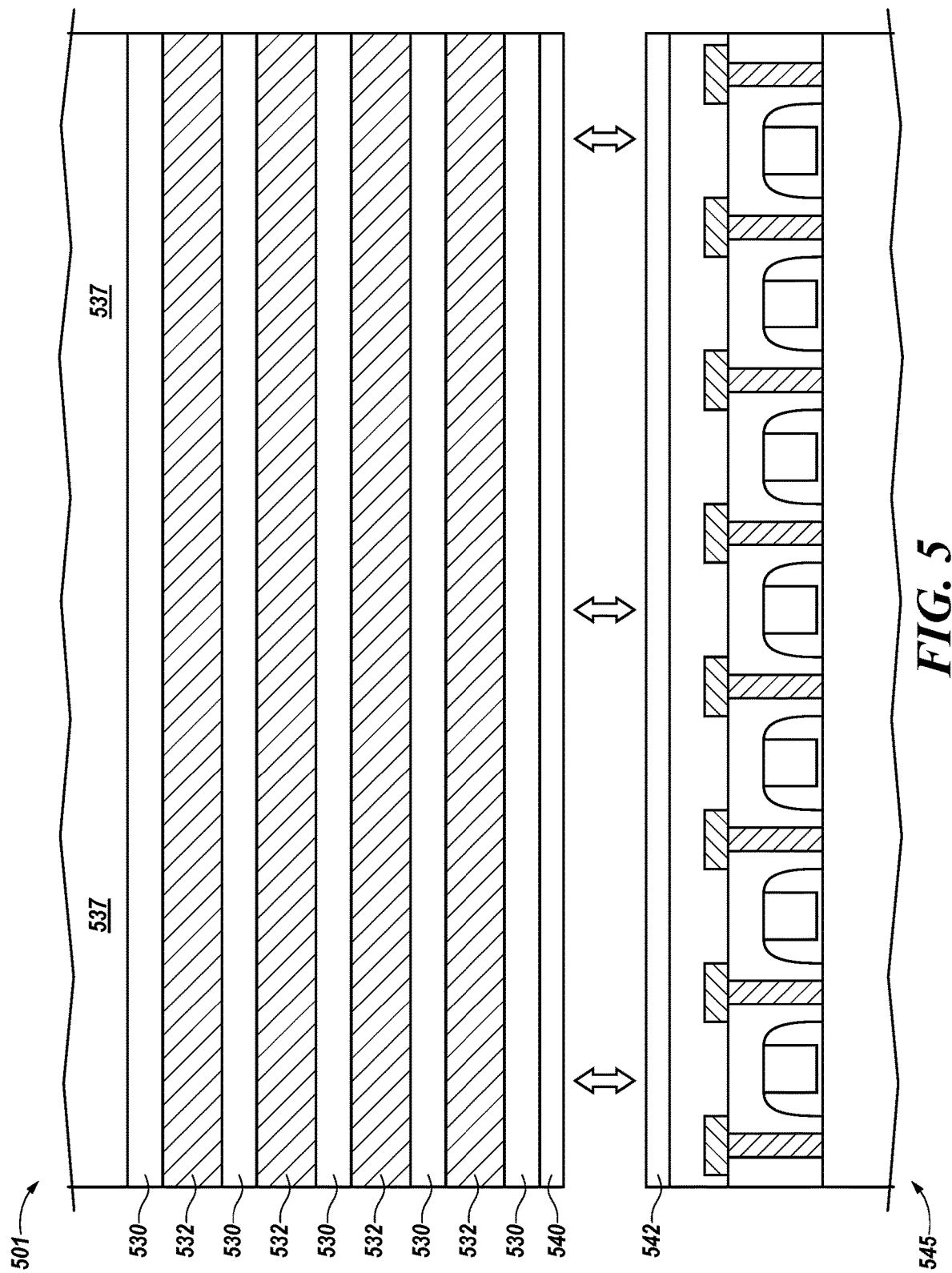
FIG. 5 illustrates an example process for bonding a single crystalline silicon stack to a CMOS wafer, in accordance with a number of embodiments of the present disclosure.

FIG. 5 illustrates an example process for bonding a single crystalline silicon stack to a CMOS wafer 545, in accordance with a number of embodiments of the present disclosure. In some embodiments, as illustrated in FIG. 5, the vertical stack 501 may be bonded to a complementary metal oxide semiconductor (CMOS) wafer 545 after the single crystal silicon germanium 530 and single crystal silicon 532 layers have been epitaxially grown onto the substrate 537 and each other to form a vertical stack of layers as illustrated in FIG. 4.

In some embodiments, the CMOS wafer 545 may include a silicon based substrate material and a transistor applicable to peripheral circuitry. That is, the CMOS components may be formed on a silicon based substrate material. In some embodiments, an unprocessed silicon layer may be bonded to the vertical stack 501 through an oxide intermediate and the unprocessed silicon layer, once bonded to the vertical stack 501, can be processed to form the CMOS components. In some implementations, this can be because the processes used to form the CMOS components can be accomplished at a lower temperature (e.g., 250° C.) than the temperatures used for the formation of the silicon and silicon germanium layers of the vertical stack.

As shown in the example process shown in FIG. 5, the vertical stack 501 can be rotated 180 degrees (e.g., flipped), such that the top silicon germanium layer (having an exposed surface) in FIG. 4 becomes a bonding surface onto which a bonding material 540 (e.g., "glue" layer) can be placed and utilized for bonding to the vertical stack 501 to the CMOS wafer 545. In FIG. 5, both the vertical stack and the CMOS wafer have bonding material thereon (540 and 542, respectively) and these materials are bonded together to bond the vertical stack and CMOS wafer, but in some implementations, the bonding material may be positioned on either the vertical stack or the CMOS wafer prior to the bonding of the vertical stack and CMOS wafer. Any suitable bonding material can be utilized for bonding the vertical stack and CMOS wafer.

Figure 6:
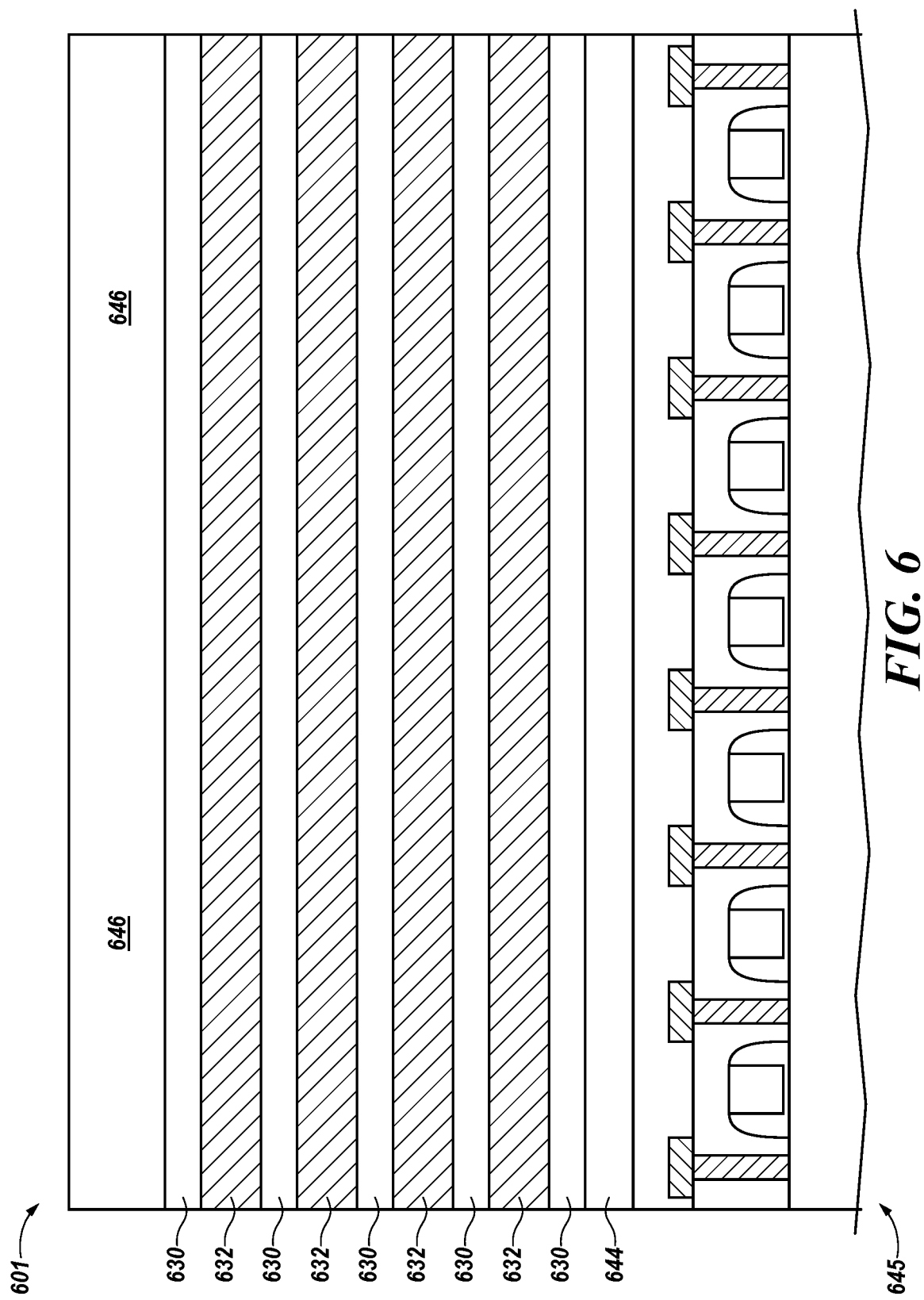
FIG. 6 illustrates another example process for bonding a single crystalline silicon stack to a CMOS wafer, in accordance with a number of embodiments of the present disclosure.

FIG. 6 illustrates another example process for bonding a single crystalline silicon stack to a CMOS wafer, in accordance with a number of embodiments of the present disclosure. As illustrated in the embodiment of FIG. 5, the bonding materials when bonded together can form a dielectric layer 644 between the vertical stack 601 and the CMOS wafer 645.

In some embodiments, as illustrated in FIG. 6, the original substrate (e.g., substrate 537 in FIG. 5) may be removed after the vertical stack 601 is bonded to the CMOS wafer 645. In the embodiment of FIG. 6, the original substrate has been removed and a hard mask material 646 has been formed in its place. This can be used during the patterning of the layers of the vertical stack.

Figure 7:
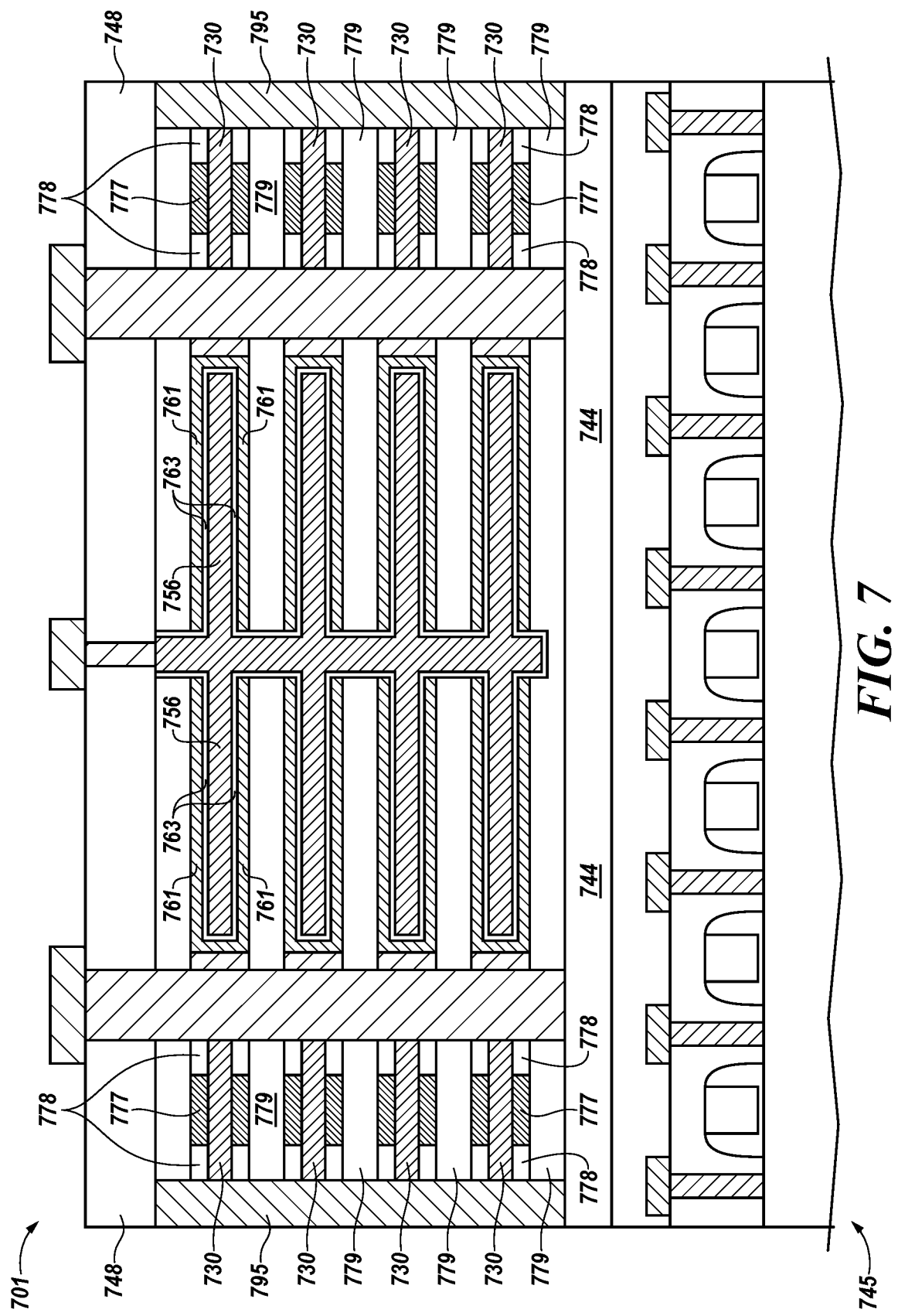
FIG. 7 illustrates an example patterned vertical memory array formed from a single crystalline silicon stack bonded to a CMOS wafer, in accordance with a number of embodiments of the present disclosure.

An example of a memory cell array that can be created from patterning the layers of the vertical stack is shown in FIG. 7. However, the vertical stack structure formed from single crystal silicon and silicon germanium is very versatile and as such can be used to make many different types of vertical memory cell arrays.

FIG. 7 illustrates an example patterned vertical memory array formed from a single crystalline silicon stack bonded to a CMOS wafer, in accordance with a number of embodiments of the present disclosure. As illustrated in FIG. 7, the memory array includes the CMOS wafer 745 bonded via bonding material 744 to the vertical stack 701 that has now been patterned to form multiple stacked memory cells. Each memory cell can, for example, be a horizontally oriented storage node (e.g., capacitor cells) having been formed via a semiconductor fabrication process, wherein first electrodes 761 (e.g., bottom electrodes to be coupled to source/drain regions of horizontal access devices) and second electrodes 756 (e.g., top electrodes to be coupled to a common electrode plane such as a ground plane) are separated by cell dielectric 763 and can have a conductive line 777. However, embodiments are not limited to the components shown in this example.

A conductive line 777 (e.g., a digit line or word line) may be formed from a conductive material provided within an interlayer dielectric (ILD) layer 778. In the illustrated structure, the top layer having a conductive line 777 and ILD 778 can be formed on top of the top single crystal silicon layer 730 when it is exposed after the removal of the mask (e.g., 646 of FIG. 6), for example, via a liner process. The single crystal silicon layers 730 can form channel regions of the memory cell. The silicon germanium layers or portions thereof can be selectively removed to form structures such as conductive line 777, a first ILD layer 778, and a second ILD layer 779. The memory cell array illustrated in FIG. 7 also shows a body contact region 795 as discussed previously with respect to FIG. 2B (e.g., conductive body contact 295) and a mask layer 748 that may be utilized as part of the memory array formation process.

The memory cell array can have source/drain regions formed therein as well. For example, a layer can be doped to form source/drain regions of an access transistor.

In some embodiments, the vertical stack memory array may be bonded to a CMOS wafer after the memory cells are formed. This may be beneficial as the two components could be formed separately and then combined which may allow for more specialized manufacturing processes that can be focused on either the CMOS wafer formation process or the memory array formation process.

As illustrated in the embodiment of FIG. 7, the bonding materials when bonded together can form a dielectric layer 744 between the vertical stack 701 and the CMOS 745.

Figure 8:
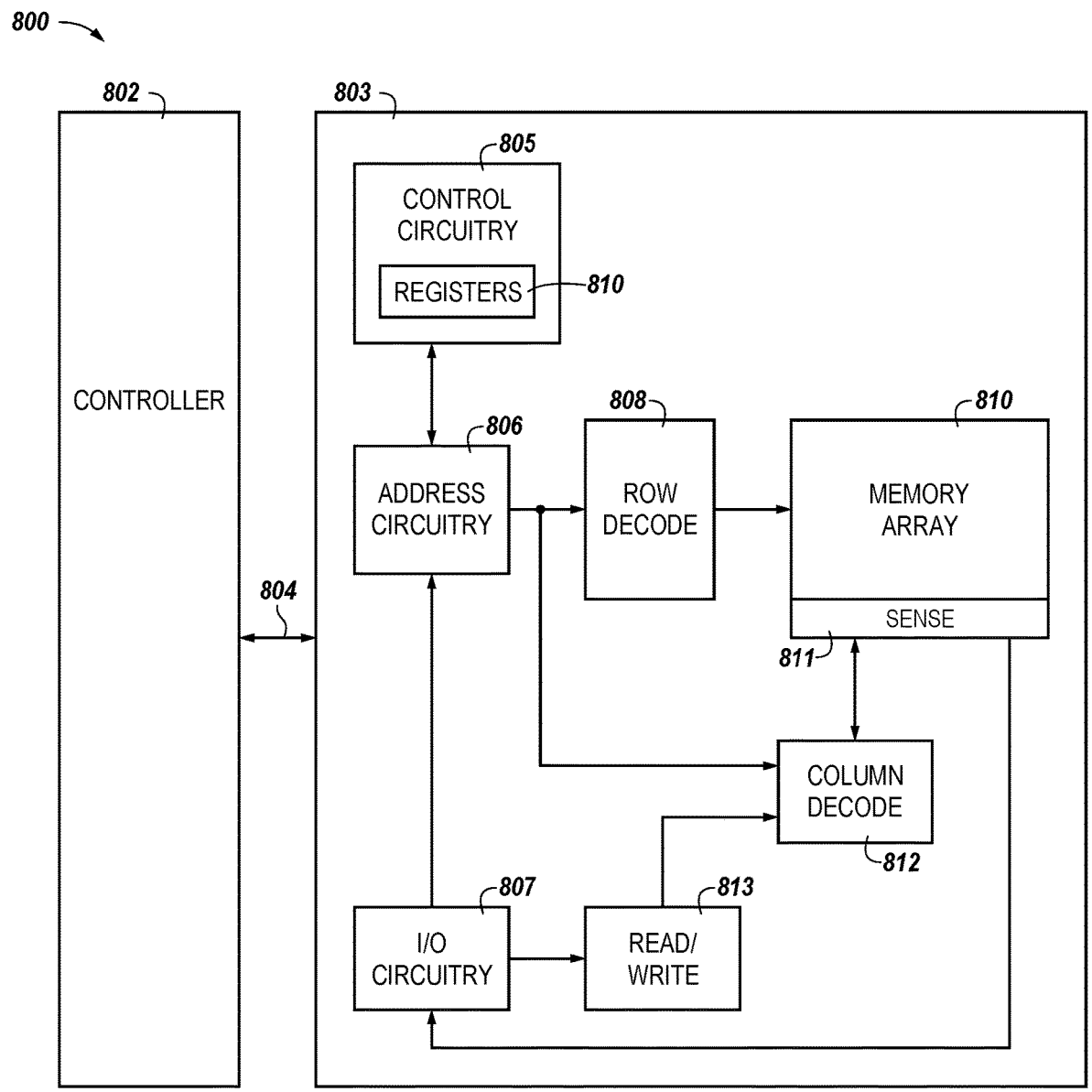
FIG. 8 is a block diagram of an apparatus in the form of a computing system including a memory device in accordance with a number of embodiments of the present disclosure.

FIG. 8 is a block diagram of an apparatus in the form of a computing system including a memory device in accordance with a number of embodiments of the present disclosure. FIG. 8 is a block diagram of an apparatus in the form of a computing system 800 including a memory device 803 in accordance with a number of embodiments of the present disclosure. As used herein, a memory device 803, a memory array 810, and/or a host 802, for example, might also be separately considered an "apparatus." According to embodiments, the memory device 802 may comprise at least one memory array 810 having a three-node access device for vertical three dimensional (3D) memory, as has been described herein.

In this example, system 800 includes a host 802 coupled to memory device 803 via an interface 804. The computing system 800 can be a personal laptop computer, a desktop computer, a digital camera, a mobile telephone, a memory card reader, or an Internet-of-Things (IoT) enabled device, among various other types of systems. Host 802 can include a number of processing resources (e.g., one or more processors, microprocessors, or some other type of controlling circuitry) capable of accessing memory 803. The system 800 can include separate integrated circuits, or both the host 802 and the memory device 803 can be on the same integrated circuit. For example, the host 802 may be a system controller of a memory system comprising multiple memory devices 803, with the system controller 805 providing access to the respective memory devices 803 by another processing resource such as a central processing unit (CPU).

In the example shown in FIG. 8, the host 802 is responsible for executing an operating system (OS) and/or various applications (e.g., processes) that can be loaded thereto (e.g., from memory device 803 via controller 805). The OS and/or various applications can be loaded from the memory device 803 by providing access commands from the host 802 to the memory device 803 to access the data comprising the OS and/or the various applications. The host 802 can also access data utilized by the OS and/or various applications by providing access commands to the memory device 803 to retrieve said data utilized in the execution of the OS and/or the various applications.

For clarity, the system 800 has been simplified to focus on features with particular relevance to the present disclosure. The memory array 810 can be a DRAM array, SRAM array, STT RAM array, PCRAM array, TRAM array, RRAM array, NAND flash array, and/or NOR flash array, comprising at least one three-node access device for three dimension (3D) memory. For example, the memory array 810 can be an unshielded DL 4F2 array such as a 3D-DRAM memory array. The array 810 can comprise memory cells arranged in rows coupled by word lines (which may be referred to herein as access lines or select lines) and columns coupled by digit lines (which may be referred to herein as sense lines or data lines). Although a single array 810 is shown in FIG. 8, embodiments are not so limited. For instance, memory device 803 may include a number of arrays 810 (e.g., a number of banks of DRAM cells).

The memory device 803 includes address circuitry 806 to latch address signals provided over an interface 804. The interface can include, for example, a physical interface employing a suitable protocol (e.g., a data bus, an address bus, and a command bus, or a combined data/address/command bus). Such protocol may be custom or proprietary, or the interface 804 may employ a standardized protocol, such as Peripheral Component Interconnect Express (PCIe), Gen-Z, CCIX, or the like. Address signals are received and decoded by a row decoder 808 and a column decoder 812 to access the memory array 810. Data can be read from memory array 810 by sensing voltage and/or current changes on the sense lines using sensing circuitry 811. The sensing circuitry 811 can comprise, for example, sense amplifiers that can read and latch a page (e.g., row) of data from the memory array 810. The I/O circuitry 807 can be used for bi-directional data communication with the host 802 over the interface 804. The read/write circuitry 813 is used to write data to the memory array 810 or read data from the memory array 810. As an example, the circuitry 813 can comprise various drivers, latch circuitry, etc.

Control circuitry 805 decodes signals provided by the host 802. The signals can be commands provided by the host 802. These signals can include chip enable signals, write enable signals, and address latch signals that are used to control operations performed on the memory array 810, including data read operations, data write operations, and data erase operations. In various embodiments, the control circuitry 805 is responsible for executing instructions from the host 802. The control circuitry 805 can comprise a state machine, a sequencer, and/or some other type of control circuitry, which may be implemented in the form of hardware, firmware, or software, or any combination of the three. In some examples, the host 802 can be a controller external to the memory device 803. For example, the host 802 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

Transistors formed using the processes described herein can have several benefits. For example, the transistors will have better performance in terms of I-on and I-off, driveability, and leakage current. Polysilicon is leaky due to graininess of the polysilicon material, but, single crystal layers have no graininess and as such, current does not leak through the single crystal materials as readily. In some implementations, the embodiments of the present disclosure can, for example, improve I-off by three orders of magnitude or better as compared to previous devices.

The figures herein follow a numbering convention in which the first digit or digits correspond to the drawing figure number and the remaining digits identify an element or component in the drawing. Similar (e.g., the same) elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). An element coupled between two elements can be between the two elements and coupled to each of the two elements.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" an other element, the particular element can cover the other element, can be over the other element or lateral to the other element and/or can be in direct physical contact the other element. Lateral to may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A method, comprising:
    forming a layer of single crystal silicon germanium onto a surface of a silicon substrate;
    epitaxially growing the silicon germanium to form a thicker single crystal silicon germanium layer;
    forming a layer of single crystal silicon onto a surface of the thicker single crystal silicon germanium layer;
    epitaxially growing the single crystal silicon to form a thicker single crystal silicon layer; and
    forming, in repeating iterations, a number of additional layers of single crystal silicon germanium and single crystal silicon to form a vertical stack of alternating single crystal silicon and single crystal silicon germanium layers.

2. The method of claim 1, further comprising, processing the vertical stack to expose a first surface of a first layer of single crystal silicon germanium and a first surface of a second layer of single crystal silicon germanium.

3. The method of claim 2, further comprising, forming a hard mask material on the first surface of the first layer of single crystal silicon germanium.

4. The method of claim 3, further comprising, forming a bonding material on the first surface of the second layer of single crystal silicon germanium.

5. The method of claim 4, further comprising, bonding the bonding material to a surface of a different substrate having a number of CMOS components formed thereon.

6. The method of claim 5, wherein the different substrate has a bonding material formed on a surface thereof, and wherein the method further comprises bonding the bonding material formed on the surface of the different substrate to the bonding material formed on the first surface of the second layer of single crystal silicon germanium.

7. The method of claim 1, further comprising, bonding the vertical stack to a different substrate having CMOS components formed thereon, the different substrate being processed separately from the substrate on which the vertical stack is formed.

8. The method of claim 1, further comprising forming vertical dynamic random access memory (DRAM) cells in the vertical stack.

9. The method of claim 8, further comprising forming access devices of the DRAM cells to have single crystal silicon channels.

10. A method, comprising:
    forming a first layer of single crystal silicon germanium onto a surface of a first substrate;
    forming a first layer of single crystal silicon onto a surface of the single crystal silicon germanium;
    forming, in repeating iterations, a number of additional layers of single crystal silicon germanium and single crystal silicon to form a vertical stack of alternating single crystal silicon and single crystal silicon germanium layers; and
    bonding a surface of the vertical stack to a second substrate.

11. The method of claim 10, wherein the second substrate comprises a number of CMOS components formed thereon, and wherein the method further comprises:
    bonding the first substrate to the second substrate subsequent to forming the vertical stack.

12. The method of claim 11, wherein the temperature range used for the formation of the vertical stack is 600 degree Celsius (° C.) to 1100° C.

13. The method of claim 11, wherein the first layer of single crystal silicon germanium serves as a seed layer, and wherein the method includes heating the first layer of single crystal silicon germanium to increase a thickness of the first layer of single crystal silicon germanium via epitaxial growth.

14. The method of claim 13, wherein the seed layer has a thickness of about 100 Angstroms.

15. The method of claim 14, wherein the thickness of the first layer of single crystal silicon germanium is about 1,000 Angstroms after the epitaxial growth.

16. The method of claim 11, wherein the first layer of single crystal silicon serves as a seed layer, and wherein the method includes heating the first layer of single crystal silicon to increase a thickness of the first layer of single crystal silicon via epitaxial growth.

17. The method of claim 16, wherein the seed layer has a thickness of about 50 Angstroms.

18. The method of claim 17, wherein the thickness of the first layer of single crystal silicon is about 300 Angstroms after the epitaxial growth.

19. A method, comprising:
- forming a vertical stack of repeating iterations of single crystal silicon germanium and single crystal silicon layers on a substrate, wherein the vertical stack includes at least two iterations, and wherein forming each iteration comprises:
  - forming a seed layer of single crystal silicon germanium;
  - epitaxially growing single crystal silicon germanium from the seed layer of crystal silicon germanium to a desired first thickness;
  - forming a seed layer of single crystal silicon onto a surface of the epitaxially grown single crystal silicon germanium; and
  - epitaxially growing single crystal silicon from the seed layer of single crystal silicon to a desired second thickness; and
- forming dynamic random access memory cells in the vertical stack.

20. The method of claim 19, wherein the method includes bonding the substrate to a different substrate prior to forming the memory cells in the vertical stack.

\* \* \* \* \*